(12) United States Patent
Huang et al.

(10) Patent No.: US 6,479,843 B2
(45) Date of Patent: *Nov. 12, 2002

(54) SINGLE SUPPLY HFET WITH TEMPERATURE COMPENSATION

(75) Inventors: Jenn-Hwa Huang, Gilbert, AZ (US); Elizabeth C. Glass, Chandler, AZ (US); Olin Hartin, Phoenix, AZ (US); Wendy L. Valentine, Gilbert, AZ (US); Julio Costa, Phoenix, AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/559,791

(22) Filed: Apr. 27, 2000

(65) Prior Publication Data

US 2002/0127787 A1 Sep. 12, 2002

(51) Int. Cl.$^7$ .............................................. H01L 21/338
(52) U.S. Cl. ................. 257/192; 438/167; 438/171; 438/191; 438/570; 438/571; 438/572; 438/573; 438/172; 257/195; 257/471; 257/472; 257/486
(58) Field of Search ................. 438/167, 171, 438/172, 191, 570, 571, 572, 573, 576, 577, FOR 181, FOR 335, FOR 336, FOR 337, FOR 339; 257/192, 195, 471, 472, 473, 476, 480, 485, 486

(56) References Cited

U.S. PATENT DOCUMENTS

| | | | | |
|---|---|---|---|---|
| 4,760,288 A | * | 7/1988 | Peczalski | ...................... 326/32 |
| 4,814,851 A | | 3/1989 | Abrokwah et al. | |
| 5,153,683 A | * | 10/1992 | Noda | .......................... 257/282 |
| 5,405,797 A | * | 4/1995 | Brugger | ...................... 438/172 |
| 5,445,985 A | * | 8/1995 | Calviello et al. | ............ 438/171 |
| 5,532,486 A | * | 7/1996 | Stanchina et al. | .......... 257/201 |

* cited by examiner

Primary Examiner—Matthew Smith
Assistant Examiner—Craig P. Lytle
(74) Attorney, Agent, or Firm—James L. Clingan, Jr.

(57) ABSTRACT

A method of fabricating apparatus, and the apparatus, for providing low voltage temperature compensation in a single power supply HFET including a stack of epitaxially grown compound semiconductor layers with an HFET formed in the stack. A Schottky diode is formed in the stack adjacent the HFET during the formation of the HFET. The HFET and the Schottky diode are formed simultaneously, with a portion of one of the layers of metal forming the gate of the HFET being positioned in contact with a layer of the stack having a low bandgap (e.g. less than 0.8 eV) to provide a turn-on voltage for the Schottky diode of less than 1.8 Volts. The Schottky diode is connected to the gate contact of the HFET by a gate circuit to compensate for changes in current loading in the gate circuit with changes in temperature.

14 Claims, 1 Drawing Sheet

SINGLE SUPPLY HFET WITH TEMPERATURE COMPENSATION

FIELD OF THE INVENTION

This invention relates to apparatus and method of temperature compensating HFETs using a single power supply.

BACKGROUND OF THE INVENTION

Advanced communication electronic devices, such as power amplifiers and the like, require high efficiency, high performance, and low current drain power semiconductor devices. Enhancement mode hetero-junction field effect transistors (HFETs) can provide single power supply operation, i.e., operate from a voltage of only one polarity. It is also desirable and a benefit in such device technology that a self-biasing capability can be provided for stabilizing device operation over temperature. A p/n junction or Schottky diode integrated with the HFET process can supply this need, The p/n junction diode, however, has a barrier potential more than 1 eV, which is too high for low voltage power amplifiers which have a drain supply voltage of about 3 volts. A turn-on voltage of about 0.6 volts or lower is desirable.

In the prior art, HFETs are fabricated with titanium tungsten nitride deposited as the gate metal contact on a stack of compound semiconductor material to form a high turn-on (e.g. 1.7 volts) Schottky barrier. Some attempts have been made to use a diode connected HFET (i.e. the gate forms one terminal and the common connected source and drain form the second terminal, as illustrated in FIG. 1) for temperature compensation in electronic devices. The major problems in using the diode connected HFET for temperature compensation are: the turn-on voltage is too high (approximately 1.7 V) for low voltage applications (some of which are required to operate at as low a supply voltage as 1.8 V) and the temperature coefficient is too low (approximately −0.4 mV/degrees C.) which does not provide for adequate compensation over the entire operating temperature range (usually −50 degrees C. to 100 degrees C.) of the electronic devices. A larger negative temperature coefficient is required to compensate the electronic devices over the entire operating range.

Accordingly it is highly desirable to provide apparatus and a method of temperature compensating with a high temperature coefficient and a low turn-on voltage.

BRIEF DESCRIPTION OF THE DRAWINGS

Referring to the drawings.

DESCRIPTION OF THE PREFERRED EMBODIMENT

Figure 2:
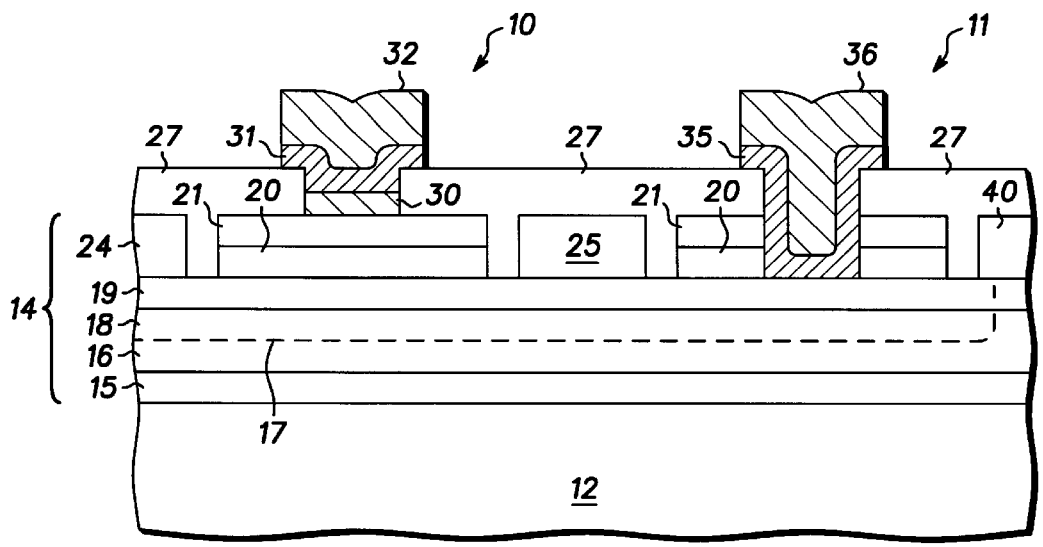
FIG. 2 is a simplified sectional view of an HFET and an adjacent Schottky diode fabricated during the same process in accordance with the present invention.

Turning now to FIG. 2, a simplified sectional view is illustrated of a heterojunction field effect transistor (HFET) 10 and an adjacent Schottky diode 11 fabricated during the same process in accordance with the present invention. In this specific embodiment and for purposes of explanation only, HFET 10 is a very large RF device (e.g. a 40 mm device that is capable of carrying amps of current) designed for use in an RF amplifier and Schottky diode 11 is a small fraction of the size of HFET 10 and carries a small fraction of the current. In the fabrication of HFET 10 and Schottky diode 11, a substrate 12 is provided with a stack 14 of compound semiconductor layers epitaxially grown thereon. While it will be understood that various compound semiconductor materials can be used to form HFET 10, in this specific embodiment, substrate 12 is a gallium arsenide (GaAs) wafer with a buffer 15, which may be one or more layers depending upon the process and materials used, formed on the upper surface thereof. A layer 16 of GaAs is grown on buffer 15 and a thin layer 17 of silicon δ-doping is deposited on layer 16. A second layer 18 of GaAs is grown on layer 17 and a channel layer 19 of indium gallium arsenide (InGaAs) is grown on layer 18. A layer 20 of aluminum gallium arsenide (AlGaAs) is grown on channel layer 19 and a cap layer 21 of GaAs is grown on layer 20 to complete stack 14.

Several different types of HFETs can be incorporated and several different processes can be used in the formation of an HFET for use in conjunction with the present invention. HFET 10 is illustrated and described only for purposes of an example to better explain the fabrication and use of the present temperature compensation circuitry. In the formation of HFET 10, openings are etched through cap layer 21 and layer 20 to expose spaced apart areas on the surface of channel layer 19. Source and drain ohmic contacts 24 and 25 are deposited in the spaced apart areas and dielectric material 27 is deposited over the entire structure. Here it will be understood that ohmic contacts 24 and 25 extend into and/or out of the paper to connect HFET 10 into associated circuitry. A gate contact area is opened through dielectric material 27 to expose cap layer 21 and a layer 30 of contact metal is deposited in contact with the upper surface of cap layer 21 to form a gate for HFET 10. Generally, the contact metal of layer 30 has included either titanium or titanium-tungsten. However, in this referred embodiment, layer 30 is formed of titanium-tungsten nitride (TiWN). A portion 31 of seed metal, such as TiWN or Ti/Au, is formed on layer 30 of contact metal and an overlay portion 32 of low resistance material, such as gold, is formed on seed metal layer 31 to complete HFET 10.

Generally, the threshold voltage of HFET 10, has a negative temperature coefficient. Thus as the temperature of HFET 10 increases, the threshold voltage required to bias HFET 10 to a desired operating point decreases. When self bias circuits are designed to deliver a constant bias voltage to the gate of HFET 10, this negative temperature coefficient results in a large variation in the operating point over temperature, which negatively impacts RF performance to specification. In single supply power HFETs using relatively low supply voltages (e.g., 2.5 V or less) this temperature dependent threshold voltage renders the entire circuit inoperative over the required temperature range (usually −50 degrees C. to 100 degrees C.). The problem is further compounded when the self bias circuit utilizes active components (HFETs and the like) that have their own temperature coefficients.

To compensate for the negative temperature coefficient problem, Schottky diode 11 is fabricated adjacent to HFET 10 in stack 14. Further, Schottky diode 11 is fabricated in the interconnect process used to fabricate HFET 10 so that few or no additional process steps are required. In a preferred embodiment of the fabrication process for Schottky diode 11, a Schottky diode area is opened through dielectric material 27 to expose the surface of cap layer 21. Further, the Schottky diode area opening is preferably formed at the deposition of contact metal layer 31. Generally, the Schottky diode area opening is defined using a standard photo resist (not shown) and a combination of wet and dry etch processes is used to etch an opening through insulation material 27 to the upper surface of cap layer 21 or into layers 21 and 20 to reach layers 19 or 18.

Here it will be understood by those skilled in the art that because of the relatively large size or length of the Schottky diode area opening standard lithographic masking and etching techniques can be used. Specific details as to a preferred etching process of insulation material 27 can be found in U.S. Pat. No. 5,484,740, entitled "Method of Manufacturing a III-V Semiconductor Gate Structure", issued Jan. 16, 1996 and U.S. Pat. No. 5,619,064, entitled "III-V Semiconductor Gate Structure and Method of Manufacture", issued Apr. 8, 1997, both of which are included herein by reference. During this etching process, an AlN layer in dielectric material 27 can be used as an etch stop layer within the Schottky diode area opening. Using insulation material 27 (and/or the photoresist layer) as an etch mask, at least some of compound semiconductor stack 14 (in this embodiment, cap layer 21 and AlGaAs layer 20) is etched to expose an upper surface of InGaAs layer 19 or even layer 18.

With the Schottky diode area opening formed as described above, the photoresist is removed and portion 31 of a layer of seed metal (TiWN in this preferred embodiment) is formed in the contact area of HFET 10 and, simultaneously, a portion 35 is formed in the Schottky diode area opening. Generally, a blanket layer of seed metal is deposited, masked, and etched to form individual portions 31 and 35 as illustrated. Portion 35 of the layer of seed metal is deposited as Schottky metal (in this preferred embodiment TiWN) to form a Schottky diode with InGaAs layer 19 or layer 18. While the seed layer is used in this embodiment to form Schottky metal portion 35, either the contact metal or the seed metal might be utilized, depending upon the type of metal and the fabrication process.

Also, one of the plurality of layers of stack 14 is used to form the Schottky diode or barrier and, specifically, Schottky metal portion 35 is positioned in contact with whichever layer of stack 14 has a desired low bandgap. In the specific stack described, InGaAs has the lowest bandgap (i.e. approximately 0.6) but other compound semiconductor materials could be included in stack 14 to provide an even lower bandgap (e.g. InAs with a bandgap less than 0.4 eV). Schottky diode 11 has a negative temperature coefficient that decreases in temperature causing the turn-on voltage of the diode to decrease.

With the seed metal layer deposited and etched to form portions 31 and 35, a low resistance overlay material is deposited and etched, in a single common process, to complete the gate and Schottky contacts. In this specific embodiment, the low resistance material is gold and gate contact portion 32 is formed on seed portion 31 and a Schottky contact 36 is formed on seed portion 35. Thus, Schottky diode 11 is fabricated adjacent to HFET 10 and simultaneous with the fabrication of HFET 10. Few or no additional steps are required in the fabrication process and the fabrication process of Schottky diode 11 is completely compatible with the fabrication process of HFET 10.

During the formation of source and drain ohmic contacts 24 and 25 of HFET 10, an opening is formed adjacent to the Schottky diode area opening through dielectric material 27, cap layer 21 and AlGaAs layer 20, at the same time that the openings for source and drain ohmic contacts 24 and 25 are formed. Further, when source and drain ohmic contacts 24 and 25 are deposited, a Schottky ohmic contact 40 is deposited to provide an external contact for the cathode of Schottky diode 11.

Figure 1:
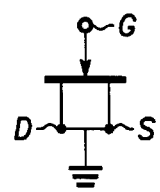
FIG. 1 is a simplified schematic view of a typical diode connected HFET.
Figure 3:
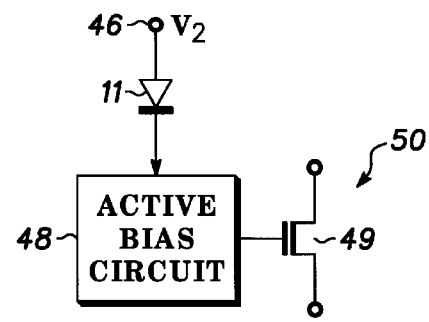
FIG. 3 is a simplified schematic/block diagram of one connection of the HFET and Schottky diode of FIG. 2.

Turning now to FIG. 3, a simplified schematic/block diagram of one possible connection of Schottky diode 11 with an RF power HFET (similar to HFET 10) is illustrated. In this circuit, the cathode of Schottky diode 11 is connected through an active bias circuit 48 to the gate of an RF power HFET 50. Here it should be understood that HFET 10 of FIG. 1 is utilized as HFET 50 in this embodiment and that generally other HFETs (e.g., those used in active bias circuit 48) may be fabricated in the same process and generally in an adjacent position on a common semiconductor chip and connected during one of the metallization processes.

Figure 4:
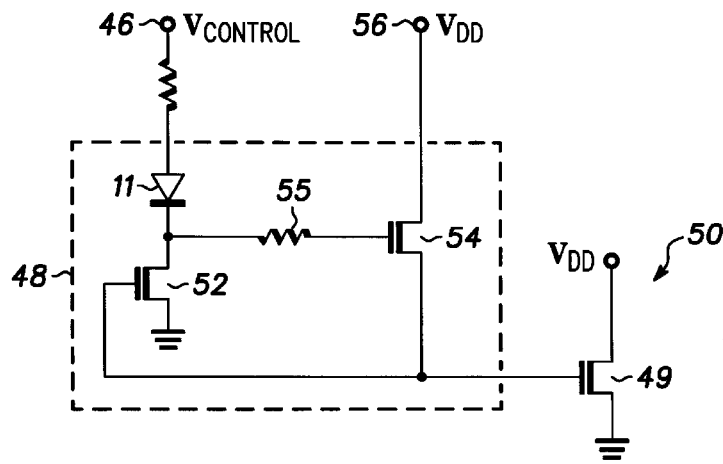
FIG. 4 is a simplified schematic diagram of one circuit which may be used as the active bias circuit of FIG. 3.

Referring additionally to FIG. 4, one possible active bias circuit is illustrated in simplified schematic form, enclosed in a broken line and designated 48. The operation of active bias circuit 48 will only be described generally. Additional information as to the construction and operation of this specific active bias circuit can be obtained from U.S. Pat. No. 5,264,784, entitled "Current Mirror with Enable", issued Nov. 23, 1993 and/or U.S. Pat. No. 5,757,236, entitled "Amplifier Bias Circuit and Method" issued May 26, 1998, both of which are incorporated herein by reference.

The anode of Schottky diode 11 is connected to a terminal 46, which is adapted to be connected to a single power supply (e.g. a 2.5 Volt supply). Generally, the power supplied to terminal 46 will be highly regulated to ensure a constant voltage. The cathode of Schottky diode 11 is connected to the drain of a FET 52, the source of which is connected to a common such as ground. The drain of FET 52 is also connected to the gate of a second FET 54 through a current limiting resistor 55. The drain of FET 54 is connected to a power terminal 56 adapted to have a source of power ($V_{dd}$) connected thereto and the source is connected to the gate of FET 52. The source of FET 54 is also connected to the gate of RF power HFET 50. Briefly, FET 52 operates as a current mirror and FET 54 operates as a source follower or current buffer. Active bias circuit 48 supplies a fixed voltage, designated $V_{gs}$ (for the gate-to-source voltage), to supply as much gate current (designated $I_{gs}$) as HFET 50 needs for proper operation. In this specific embodiment, Schottky diode 11 is connected to active bias circuit 48 to provide positive temperature compensation for HFET 50.

FET 52 has a temperature coefficient of approximately −0.5 mV/° C. while Schottky diode 11 has a temperature coefficient of approximately −1 to −2 mV/° C. Also, because of the position of Schottky diode 11 in the circuit, its temperature coefficient has an opposite effect on the overall circuit to that of the temperature coefficient of HFET 50. Thus, the positive temperature coefficient of active bias circuit 48, including Schottky diode 11 and FET 52, is connected to gate contact 49 of HFET 50 to compensate for changes of current loading in the circuit of HFET 50 with changes in temperature. It will of course be understood that many other circuits involving HFET 10 and Schottky diode 11 may be devised to compensate for changes in temperature and the present circuit is disclosed only for purposes of explanation.

In this specific embodiment and for purposes of this explanation, the voltage $V_{dd}$ applied to terminal 46 is 2.5 volts. The required bias voltage for HFET 50 is approximately 0.7 Volt. Thus, a maximum of 0.8 Volts remains for turning on any temperature compensation circuitry and any drop across any parasitic resistance in the gate circuit of HFET 50. Since the novel Schottky diode 11 disclosed herein is turned on at approximately 0.6 Volts or less and compensates for any changes in active bias circuit 48 (i.e. the turn-on voltage reduces as temperature rises), it can be seen that the present circuit fits within the requirements of apparatus for providing low voltage temperature compensation in a single power supply HFET.

Thus, a new and improved Schottky diode and HFET are disclosed which are formed simultaneously during the same process with few or no additional steps and which can be conveniently connected into a temperature compensation circuit. The Schottky diode requires very little additional wafer area and, therefore, adds very little or no additional cost or labor. Also, because the Schottky diode is formed in conjunction with a low bandgap material, it has a very low turn-on voltage and can be conveniently incorporated with a single power supply HFET.

While we have shown and described specific embodiments of the present invention, further modifications and improvements will occur to those skilled in the art. We desire it to be understood, therefore, that this invention is not limited to the particular forms shown and we intend in the appended claims to cover all modification that do not depart from the spirit and scope of this invention.

What is claimed is:

1. Apparatus for providing low voltage temperature compensation in a single power supply hetero-junction field effect transistor comprising:
    a substrate including a stack of epitaxially grown compound semiconductor layers formed thereon, the stack including a first epitaxially grown compound semiconductor layer;
    a hetero-junction field effect transistor formed in at least a first portion of the stack, the first portion including the first epitaxially grown compound semiconductor layer, the hetero-junction field effect transistor having a channel with source and drain ohmic contacts and a gate contact operatively associated with the channel, the gate contact including a plurality of layers of metal, the hetero-junction field effect transistor having a first turn-on voltage; and
    a Schottky diode formed in at least a second portion of the stack, the second portion including the first epitaxially grown compound semiconductor layer, the Schottky diode being adjacent the hetero-junction field effect transistor and with two terminals, the Schottky diode including one of the plurality of layers of metal positioned in contact with a layer of the stack having a low bandgap, the Schottky diode having a negative temperature coefficient and second turn-on voltage less than the first turn-on voltage.

2. Apparatus for providing low voltage temperature compensation in a single power supply hetero-junction field effect transistor as claimed in claim 1 wherein the layer of the stack having the low bandgap has a bandgap below approximately 1.6 eV.

3. Apparatus for providing low voltage temperature compensation in a single power supply hetero-junction field effect transistor as claimed in claim 2 wherein the layer of the stack having the low bandgap includes one of gallium arsenide and indium gallium arsenide.

4. The apparatus for providing low voltage temperature compensation in a single power supply heterojunction field effect transistor as claimed in claim 1 wherein the second turn-on voltage is below approximately 0.8 Volts.

5. The apparatus for providing low voltage temperature compensation in a single power supply heterojunction field effect transistor as claimed in claim 4 wherein the heterojunction field effect transistor has a single power supply of approximately 2.5 volts connected thereto and the first turn-on voltage is approximately 1.7 Volts.

6. Apparatus for providing low voltage temperature compensation in a single power supply hetero-junction field effect transistor as claimed in claim 1 wherein the hetero-junction field effect transistor includes a negative temperature coefficient and the Schottky diode is connected to the gate contact of the hetero-junction field effect transistor by a gate circuit to compensate for changes of current loading in the gate circuit with changes in temperature.

7. Apparatus for providing low voltage temperature compensation in a single power supply hetero-junction field effect transistor as claimed in claim 1 wherein the plurality of layers of metal include a layer of contact metal, a layer of seed metal, and a layer of low resistance metal.

8. Apparatus for providing low voltage temperature compensation in a single power supply hetero-junction field effect transistor as claimed in claim 7 wherein the one of the plurality of layers of metal included in the Schottky diode is the layer of seed metal.

9. Apparatus for providing low voltage temperature compensation in a single power supply hetero-junction field effect transistor as claimed in claim 7 wherein the layer of contact metal and the layer of seed metal both include TiWN.

10. Apparatus for providing low voltage temperature compensation in a single power supply hetero-junction field effect transistor as claimed in claim 7 wherein the low resistance metal overlay is gold and a second portion of the low resistance metal overlay is positioned on the second portion of the layer of seed metal.

11. An apparatus for providing low voltage temperature compensation in a single power supply hetero-junction field effect transistor comprising:
    a substrate including a stack of epitaxially grown compound semiconductor layers formed thereon, the stack including a first epitaxially grown compound semiconductor layer;
    a hetero-junction field effect transistor formed in at least a first portion of the stack, the first portion including the first epitaxially grown compound semiconductor layer, the hetero-junction field effect transistor having a channel with source and drain ohmic contacts and a gate contact operatively associated with the channel, the gate contact including a layer of contact metal, a first portion of seed metal, and a first portion of low resistance metal overlay positioned on the first portion of seed metal, the hetero-junction field effect transistor characterized as having a first turn-on voltage and a first negative temperature coefficient;
    a Schottky diode formed in at least a second portion of the stack, the second portion including the first epitaxially grown compound semiconductor layer, the Schottky diode being adjacent the hetero-junction field effect transistor and with two terminals externally accessible, the Schottky diode including a second portion of the seed metal positioned in contact with a layer of the stack and a second portion of the low resistance metal overlay positioned on the second portion of the seed metal, the Schottky diode having a second negative temperature coefficient and a second turn-on voltage that is less than the first turn-on voltage; and a gate circuit, coupled to hetero-junction field effect transistor, to compensate for changes of current loading in the gate circuit with changes in temperature, the gate circuit comprising the Schottky diode.

12. Apparatus for providing low voltage temperature compensation in a single power supply hetero-junction field effect transistor as claimed in claim 11 wherein the contact metal and the seed metal are TiWN.

13. Apparatus for providing low voltage temperature compensation in a single power supply hetero-junction field effect transistor as claimed in claim 11 wherein the layer of the stack having the low bandgap includes one of gallium arsenide and indium gallium arsenide.

14. The apparatus of claim 11, wherein the second negative temperature coefficient is more negative than the first negative temperature coefficient.

* * * * *